United States Patent
Kang

(10) Patent No.: US 7,673,280 B2
(45) Date of Patent: Mar. 2, 2010

(54) OPTICAL PROXIMITY CORRECTION (OPC) PROCESSING METHOD FOR PREVENTING THE OCCURRENCE OF OFF-GRID

(75) Inventor: Jae-Hyun Kang, Gyeonggi-do (KR)

(73) Assignee: Dongbu HiTek Co., Ltd., Seoul (KR)

(*) Notice: Subject to any disclaimer, the term of this patent is extended or adjusted under 35 U.S.C. 154(b) by 234 days.

(21) Appl. No.: 11/841,063

(22) Filed: Aug. 20, 2007

(65) Prior Publication Data
US 2008/0052661 A1 Feb. 28, 2008

(30) Foreign Application Priority Data
Aug. 23, 2006 (KR) .................. 10-2006-0080095

(51) Int. Cl.
*G06F 17/50* (2006.01)
(52) U.S. Cl. .......................... 716/21; 716/19
(58) Field of Classification Search ............ None
See application file for complete search history.

(56) References Cited

U.S. PATENT DOCUMENTS

| | | | | |
|---|---|---|---|---|
| 5,936,868 A | * | 8/1999 | Hall | 716/4 |
| 6,343,370 B1 | * | 1/2002 | Taoka et al. | 716/21 |

FOREIGN PATENT DOCUMENTS

KR 2005-0070846 7/2005

* cited by examiner

*Primary Examiner*—Leigh Marie Garbowski
(74) *Attorney, Agent, or Firm*—Sherr & Vaughn, PLLC

(57) ABSTRACT

An optical proximity correction (OPC) processing method may include at least one of the following steps: Detecting coordinate values of individual piece patterns constituting a graphic design system (GDS). Merging to the form of a specific pattern, composed of outermost coordinate values, on the basis of the detected coordinate values. Shrinking the merged GDS pattern and forming a GDS pattern having a desired magnifying power. Performing an optical proximity correction (OPC) process on the GDS pattern having the desired magnifying power.

20 Claims, 6 Drawing Sheets

OPTICAL PROXIMITY CORRECTION (OPC) PROCESSING METHOD FOR PREVENTING THE OCCURRENCE OF OFF-GRID

This application claims the benefit under 35 U.S.C. 119 to Korean Patent Application No. 10-2006-0080095, filed on Aug. 23, 2006, which is hereby incorporated by reference in its entirety.

BACKGROUND

In many semiconductor applications, semiconductor devices are relatively highly integrated (e.g. the size of semiconductor devices is relatively small). In relatively highly integrated semiconductor devices, an arrangement density may be relatively high. In relatively highly integrated semiconductor devices, critical dimension of a mask pattern may be close to resolution thresholds of optical exposure devices (e.g. an optical light-exposure device).

Optical proximity correction (OPC) may be used to compensate for resolution limitations in a photolithography process. In OPC, a mask pattern for a test may be manufactured as a test pattern. A pattern may be transcribed onto a semiconductor substrate using the mask pattern through photolithography. Etching of the pattern may be performed, such that a semiconductor pattern for a test is manufactured on the substrate.

OPC may be utilized with design rules that are relatively small. However, bridge and/or pinching issues may arise due to OPC limitations, which may result in complications (e.g. a critical yield drop). For example, if a particular OPC can not draw a mask pattern according to a 0.16 µm semiconductor design rule due to photolithography resolution limitations, shrinking (or minimizing) may be performed using a 0.18 µm mask pattern to achieve 0.16 µm dimensions. When shrinking is performed, an off-grid phenomenon may occur.

An off-grid phenomenon may have a negative influence in many OPC applications (e.g. model-based OPC and rule-based OPC). For example, as illustrated in example FIG. 1A, if a mask is designed in a beam spot having a 4 nm size on the basis of a line critical dimension (CD) of 190 nm, a 15 nm off-grid phenomenon occurs at a pitch of 390 nm. However, for example, an off-grid phenomenon may not occur in a pitch between 450 nm and 515 nm.

Figure 1A:
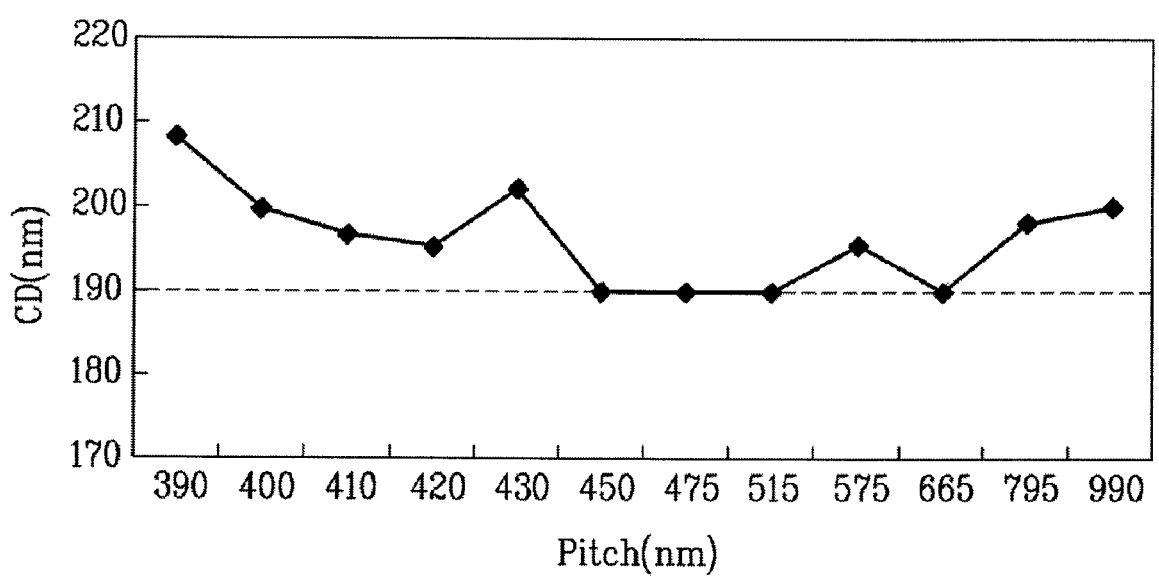
Figure 1B:
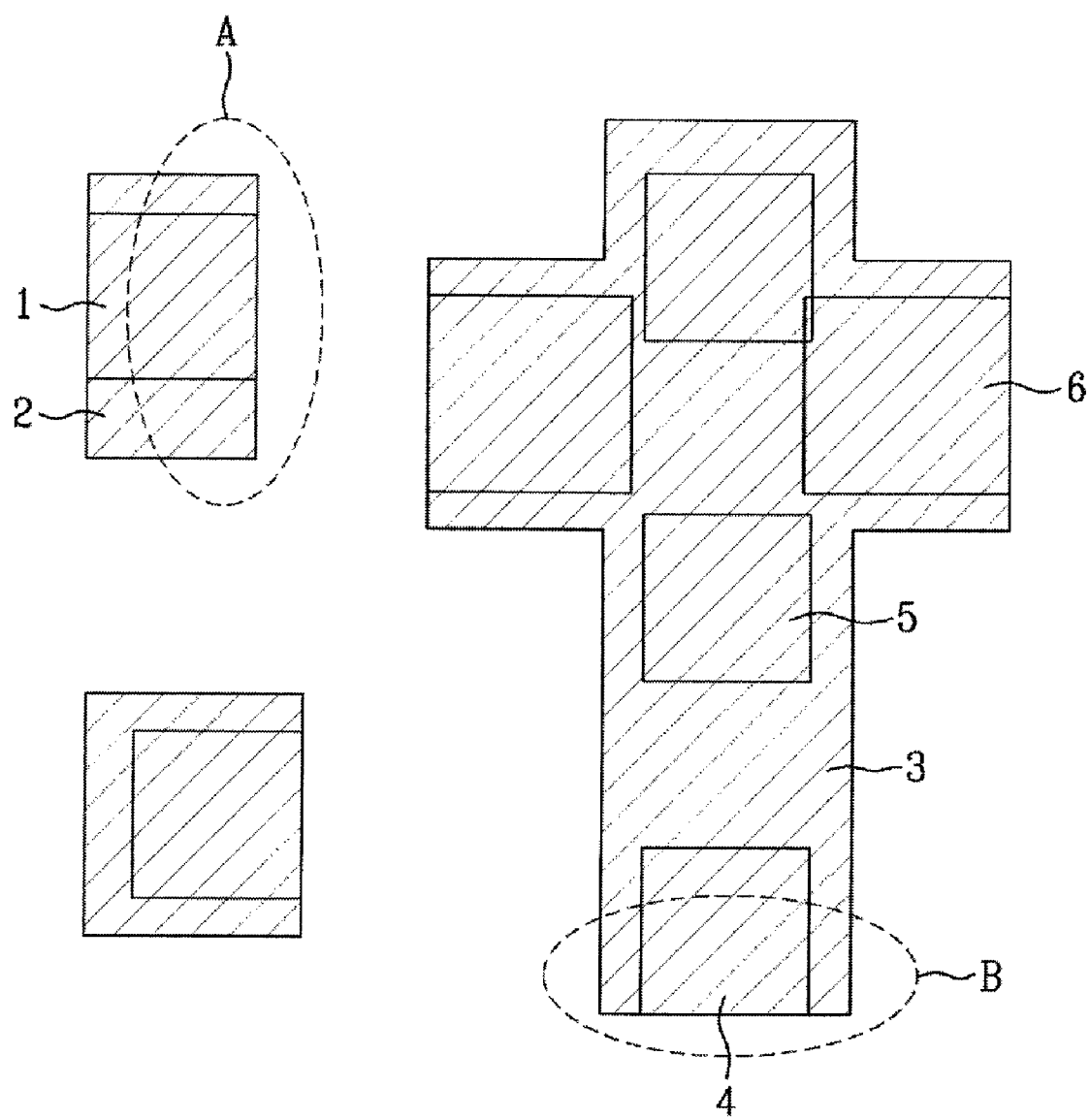

As illustrated in example FIG. 1B, a graphic design system (GDS) may be divided into several pattern pieces (e.g. pattern piece 1, pattern piece 2, pattern piece 4, pattern piece 5, and/or pattern piece 6) to manufacture a mask pattern 3. The pattern pieces may overlap each other to form mask pattern 3.

Pattern piece 1, pattern piece 2, pattern piece 4, pattern piece 5, and/or pattern piece 6 may have different sizes. If pattern pieces are shrunk, mask pattern 3 may not satisfy a 1 nm grid of a minimum database unit. For example, a CD pattern of 105 nm is shrunk by 90%, the resulting CD pattern will be 94.5 nm. However, in this example, the size of the CD pattern will be randomly either 95 nm or 94 nm, since the size of 94.5 nm can not be drawn. Accordingly, as illustrated in example FIG. 1C, the off-grid phenomenon occurs at highlighted section A and highlighted section B, which may result in an unintended mask pattern.

SUMMARY

Embodiments relate to an optical proximity correction (OPC) processing method which may prevent and/or minimize an off-grid phenomenon. In embodiments, an OPC processing method may prevent and/or minimize an off-grid phenomenon when miniaturizing a pattern.

In embodiments, an optical proximity correction (OPC) processing method may include at least one of the following steps: Detecting coordinate values of individual piece patterns constituting a graphic design system (GDS). Merging to the form of a specific pattern, composed of outermost coordinate values, on the basis of the detected coordinate values. Shrinking the merged GDS pattern and forming a GDS pattern having a desired magnifying power. Performing an optical proximity correction (OPC) process on the GDS pattern having the desired magnifying power.

In embodiments, the step of detecting/storing the coordinate values of the piece patterns includes configuring the individual piece patterns in the form of a square pattern, with the coordinate values of each piece pattern indicating coordinate values of each edge of the squared piece pattern. In embodiments, the step of merging includes interconnecting the outermost coordinate values and forming a single pattern drawn by a single edge line. In embodiment, the step of forming the GDS pattern having the desired magnifying power includes shrinking the merged GDS patterns on the basis of a specific point of any one of the merged GDS patterns. In embodiments, the method includes a step of forming a predetermined mask pattern by transferring the OPC-processed GDS pattern information to a mask pattern fabrication device.

DRAWINGS

Example FIG. 1A is a graph illustrating an off-grid phenomenon.

Example FIG. 1B illustrates a method of manufacturing a mask pattern.

Figure 1C:
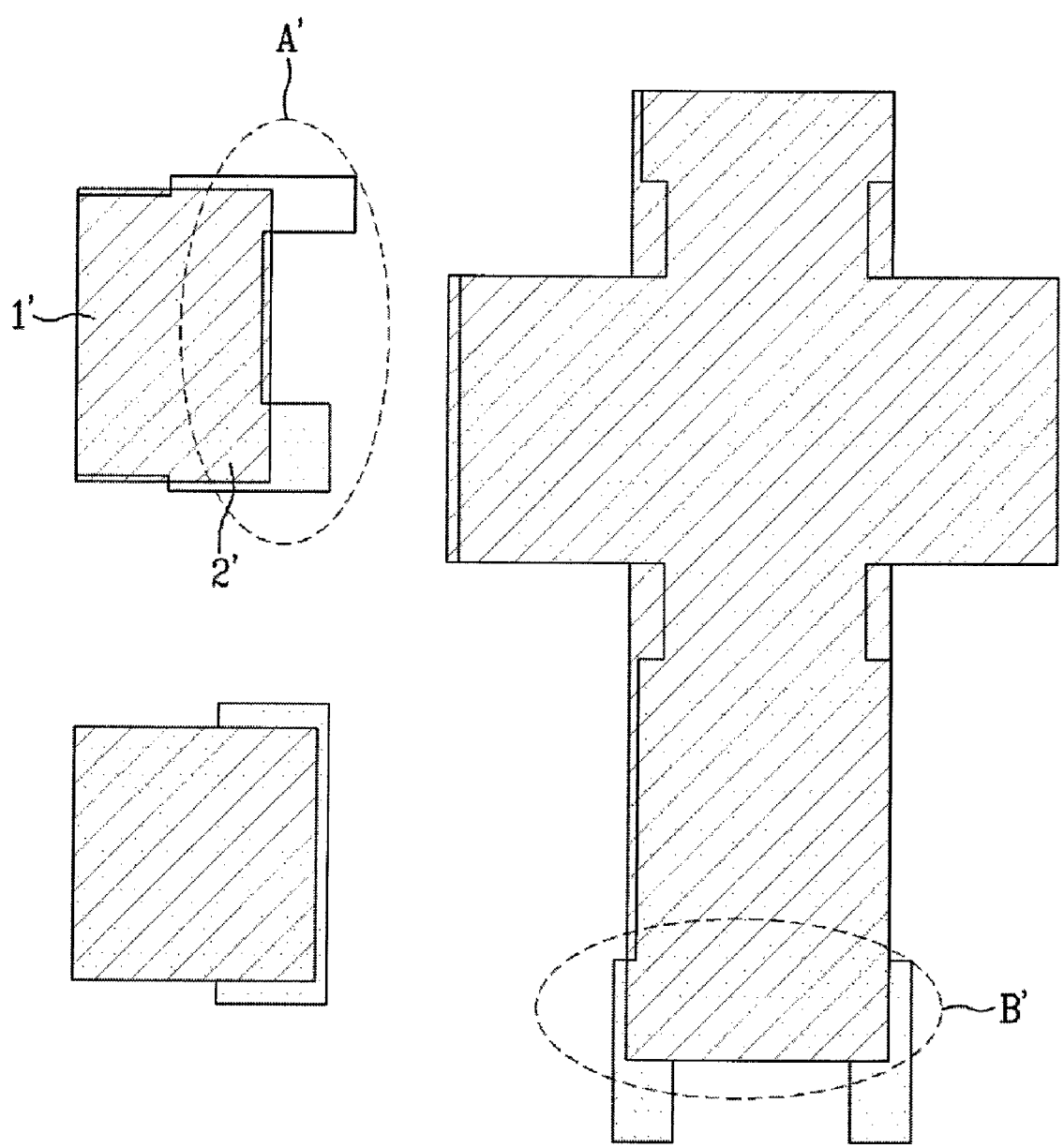

Example FIG. 1C illustrates a mask pattern including an off-grid phenomenon.

Figure 2:
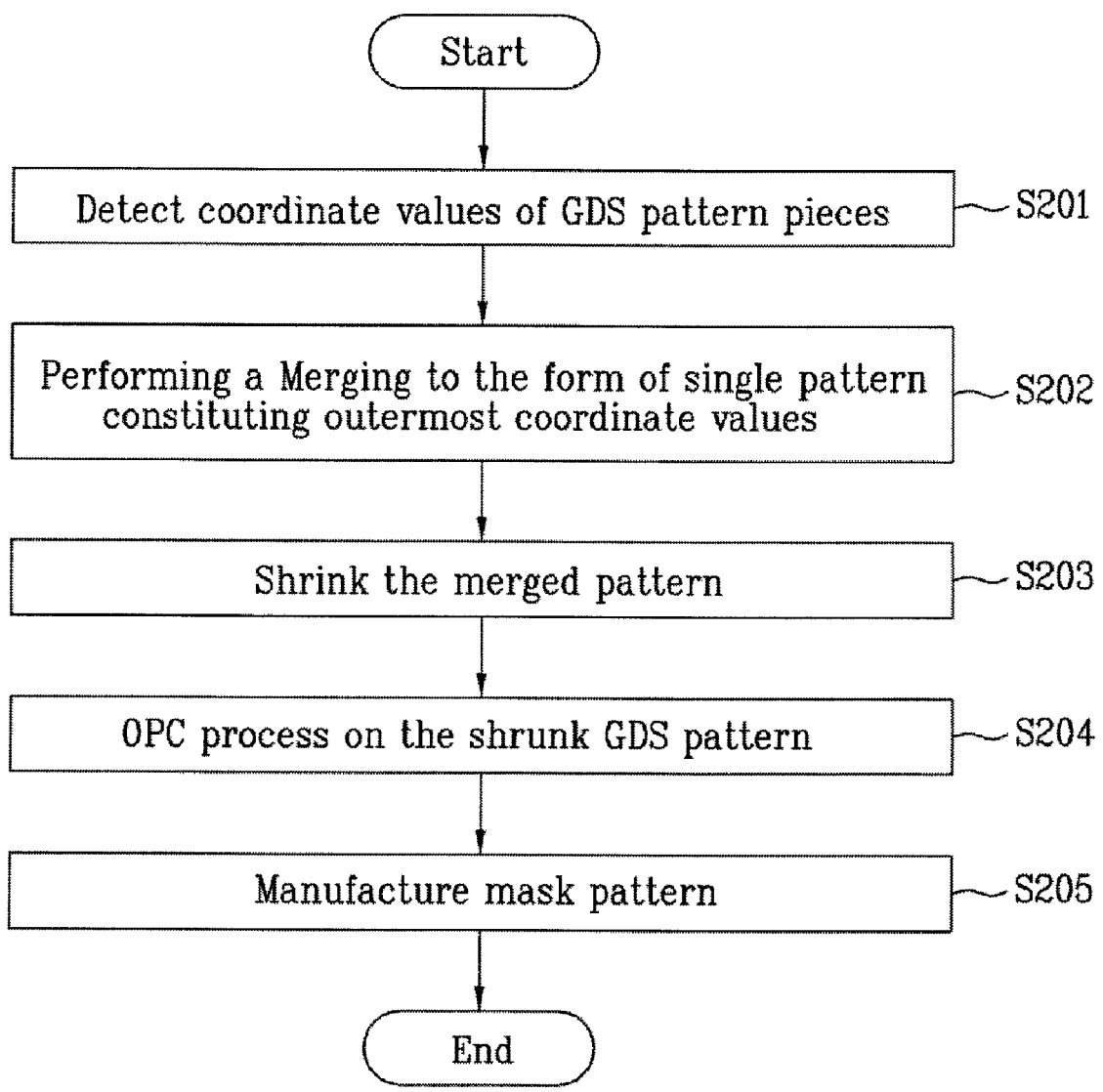

Example FIG. 2 is a flow chart illustrating an OPC processing method, according to embodiments.

Figure 3A:
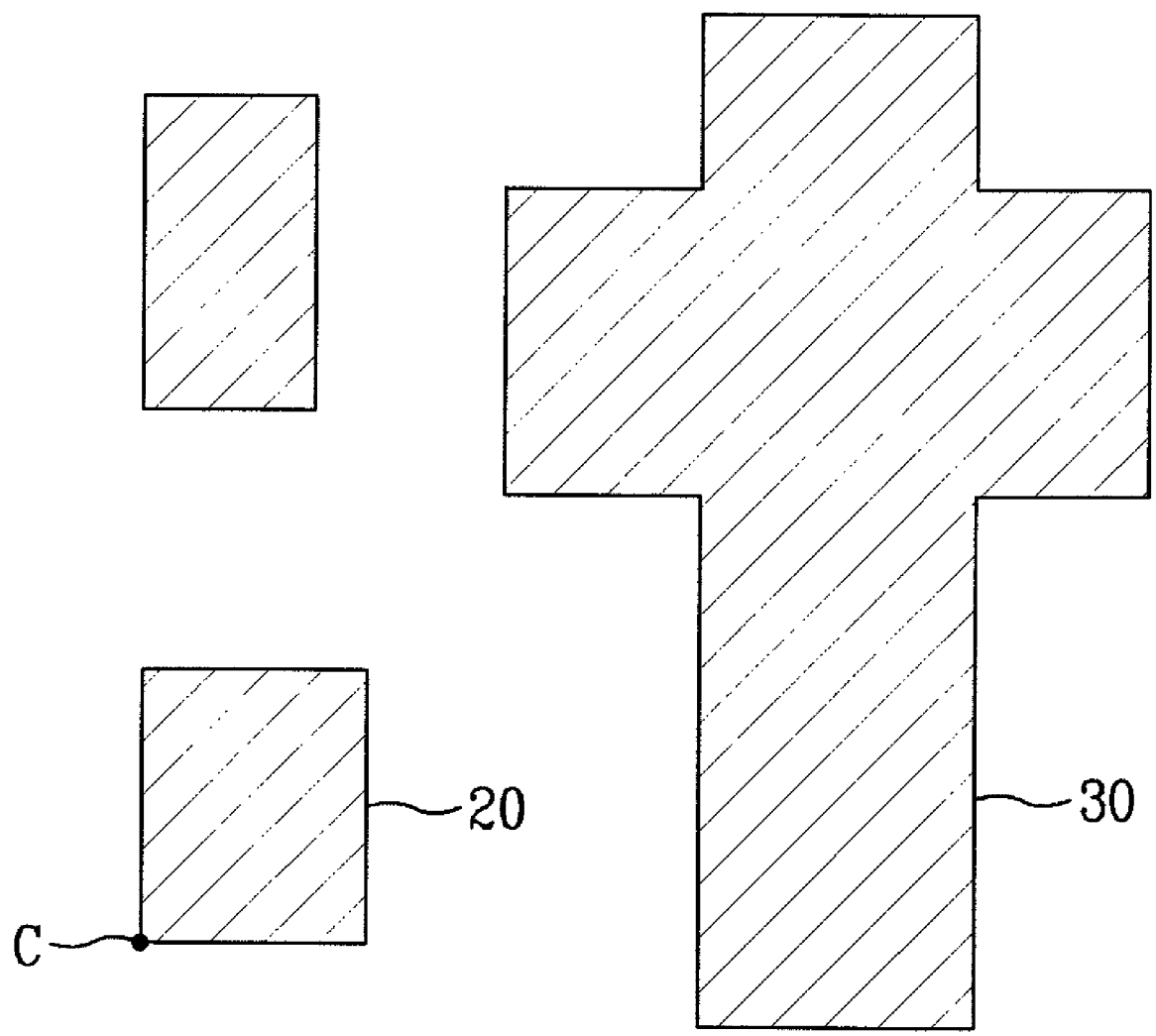

Example FIG. 3A is a conceptual diagram illustrating a mask pattern processed by an OPC method, according to embodiments.

Figure 3B:
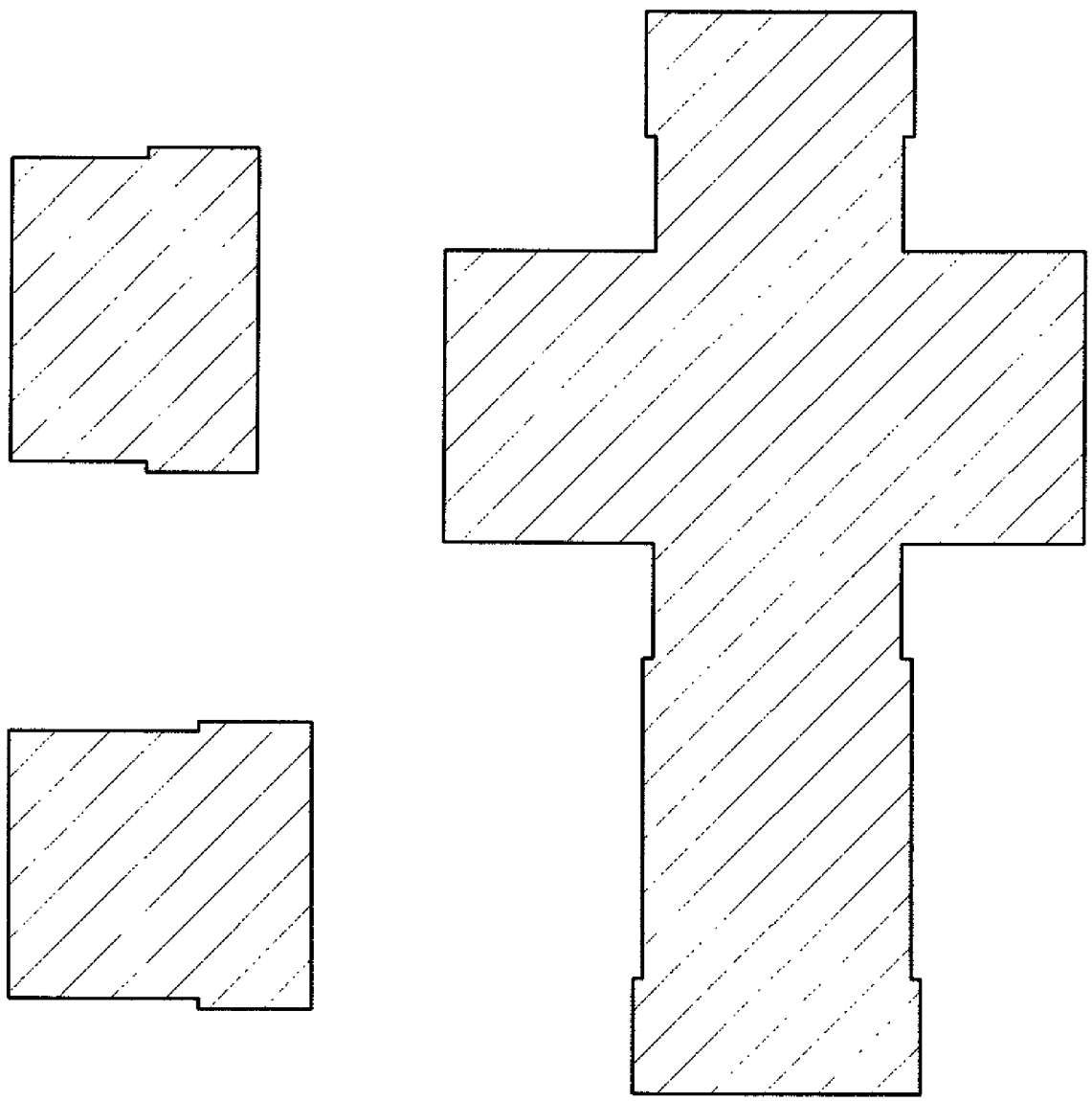

Example FIG. 3B is a conceptual diagram illustrating a mask pattern, according to embodiments.

DESCRIPTION

Example FIG. 2 is a flow chart illustrating an OPC processing method, according to embodiments. An OPC processing method, in accordance with embodiments, may detect coordinate values of parts of a GDS pattern that may generate an off-grid phenomenon (S201). In embodiments, coordinate values that may generate an off-grid phenomenon may be from GDS patterns generated by a minimum jog area and/or an auto-CAD task. Detected coordinate values may be stored as database (DB) data, in accordance with embodiments.

In embodiments, an OPC processing method may detect coordinate values of individual piece 4, individual piece 5, and individual piece 6 from GDS pattern 3 illustrated in example FIG. 1B. For example, an OPC processing method may detect edge coordinate values of individual piece 4, individual piece 5, and individual piece 6 and store detected edge coordinate values as DB data in a memory, according to embodiments.

In embodiments, an OPC processing method may merge the detected individual pieces (e.g. individual pieces 4, 5, and 6 of GDS pattern 3) to make the form of a single pattern defined by outermost coordinate values (step S202). For example, a merge may detect outermost coordinate values of coordinate values of individual pieces 4, 5, and 6 included in GDS pattern 3 (illustrated in example FIG. 1B) and interconnect the outermost coordinate values to form a single edge line (e.g. edge line of single pattern 30 illustrated in example FIG. 3A). Accordingly, instead of a GDS pattern that includes multiple individual pieces (e.g. individual pieces 4, 5, and 6 of example FIG. 1B), GDS pattern 30 of example FIG. 3A has as a single clear GDS pattern, in accordance with embodiments.

In embodiments, GDS pattern 30 may be shrunk (step S203), as illustrated in example FIG. 3A. A shrunk pattern may result in a pattern with a predetermined shape and having a desired magnifying power, in accordance with embodiments. For example, if a mask pattern for a 0.18 μm—grade semiconductor design shrinks to form a mask pattern for a 0.16 μm—grade semiconductor design rule, an OPC processing method may shrink the merged GDS pattern 30 by 89% based on a predetermined point C of the GDS pattern area. Accordingly, a GDS pattern based on a 0.16 μm—grade semiconductor design can be formed, as shown in FIG. 3A, in accordance with embodiments.

In embodiments, an OPC process may be performed on a shrunk GDS pattern (step S204). An OPC process may be applied to a GDS pattern based on beam-spot sizes for mask fabrication and step sizes (e.g. line critical dimensions (CD)) to form the OPC-processed GDS pattern illustrated in example FIG. 3B. The OPC-processed GDS pattern illustrated in example FIG. 3B may avoid or minimize occurrences of the off-grid phenomenon caused during mask fabrication.

In embodiments, OPC-processed GDS pattern information may be re-detected as DB data and/or transmits the detected GDS pattern information to a mask pattern fabrication device (step S205). In embodiments, a mask pattern having a relatively high reliability may be manufactured at step S205.

An OPC processing method may prevent the occurrence of OPC errors by shrinking a DB of a merged GDS pattern to avoid and/or minimize an off-grid phenomenon, in accordance with embodiments. In embodiments, critical dimensions of a mask pattern may be implemented in a relatively precise manner. Embodiments may prevent the occurrence of OPC errors and/or may prevent the occurrence of an off-grid phenomenon, which may result in a mask pattern being relatively precisely formed.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a pattern comprising:
   detecting coordinate values of individual piece patterns of a graphic design system;
   merging said individual piece patterns to the form of a merged pattern, wherein the merged pattern is defined by outermost coordinate values of the detected coordinate values;
   shrinking the merged pattern to form a shrunk graphic design system pattern having a predefined magnifying power;
   performing optical proximity correction on the shrunk graphic design system pattern to generate mask fabrication information; and
   forming a pattern on a semiconductor substrate using the mask fabrication information.

2. The method of claim 1, wherein the method at least one of prevents and minimizes occurrence of an off-grid phenomenon.

3. The method of claim 1, wherein:
   said individual piece patterns have a rectangular shape; and
   said detected coordinate values of individual piece patterns comprise coordinate values of each edge of the rectangular shape.

4. The method of claim 3, wherein the rectangular shape is a square shape.

5. The method of claim 1, wherein said merging said individual piece patterns comprises interconnecting said outermost coordinate values to form lines along the periphery of the merged pattern.

6. The method of claim 1, wherein said shrinking the merged pattern comprises shrinking the merged pattern based on a predetermined point of the merged pattern.

7. The method of claim 1, wherein:
   the merged pattern is based on a 0.18 μm-grade semiconductor design; and
   said shrunk graphic design system pattern is based on a 0.16 μm-grade semiconductor design.

8. The method of claim 1, comprising transferring the mask fabrication information to a mask pattern fabrication device.

9. The method of claim 8, wherein the mask pattern fabrication device forms a mask based on the mask fabrication information.

10. The method of claim 1, wherein said detecting coordinate values comprises detecting coordinate values which are susceptible to an off-grid phenomenon based on a minimum jog area and an auto-CAD task.

11. A method of manufacturing a mask pattern comprising:
    detecting coordinate values of piece patterns of a graphic design system;
    merging said individual piece patterns to form a merged pattern defined by outermost coordinate values of the detected coordinate values;
    shrinking the merged pattern to form a shrunk graphic design system pattern having a predefined magnifying power;
    performing optical proximity correction on the shrunk graphic design system pattern to generate mask fabrication information; and then
    performing a etching process to form a mask pattern on a semiconductor substrate using the mask fabrication information.

12. The method of claim 11, wherein said detected coordinate values of the piece patterns comprise coordinate values of each edge of the rectangular shape.

13. The method of claim 11, further comprising, after detecting coordinate values of piece patterns and before merging said individual piece patterns:
    storing the detected coordinate values in a memory.

14. A method of manufacturing a mask pattern comprising:
    detecting coordinate values of a plurality of piece patterns of a graphic design system;
    storing the detected coordinate values in a memory;
    forming a single merged pattern by merging said plurality of piece patterns, wherein the merged pattern is defined by outermost coordinate values of the detected coordinate values;
    forming a shrunk pattern having a predetermined shape and predetermined magnifying power by shrinking the merged pattern;
    generating mask fabrication information by conducting an optical proximity correction process on the shrunk pattern;

detecting the mask fabrication information; and performing a etching process to form a mask pattern on a semiconductor substrate using the mask fabrication information.

15. The method of claim 14, wherein storing the detected coordinate values comprises storing the detected coordinate values as database data.

16. The method of claim 14, wherein detecting the mask fabrication information comprises detecting the mask fabrication information as database data.

17. The method of claim 14, wherein said piece patterns have a rectangular shape.

18. The method of claim 17, wherein said detected coordinate values of the piece patterns comprise coordinate values of each edge of the rectangular shape.

19. The method of claim 14, wherein said merging said piece patterns comprises interconnecting said outermost coordinate values to form lines along the periphery of the single pattern.

20. The method of claim 14, wherein conducting an optical proximity correction process on the shrunk pattern is based on beam-spot sizes for mask fabrication and step sizes.

* * * * *